United States Patent [19]
Ying et al.

[11] Patent Number: 5,811,331
[45] Date of Patent: Sep. 22, 1998

[54] FORMATION OF A STACKED CYLINDRICAL CAPACITOR MODULE IN THE DRAM TECHNOLOGY

[75] Inventors: Tse-Liang Ying; Mong-Song Liang, both of Hsin-Chu, Taiwan

[73] Assignee: Taiwan Semiconductor Manufacturing Company Ltd., Hsin-Chu, Taiwan

[21] Appl. No.: 719,236

[22] Filed: Sep. 24, 1996

[51] Int. Cl.$^6$ .............................. H01L 21/8242
[52] U.S. Cl. .................. 438/253; 438/254; 438/396; 438/397
[58] Field of Search ..................... 438/253, 254, 438/396, 397

[56] References Cited

U.S. PATENT DOCUMENTS

| | | | |
|---|---|---|---|
| 5,043,298 | 8/1991 | Yamada et al. | 438/253 |
| 5,114,873 | 5/1992 | Kim et al. | 438/253 |
| 5,135,883 | 8/1992 | Bae et al. | 438/253 |
| 5,196,365 | 3/1993 | Gotou | 438/254 |
| 5,332,685 | 7/1994 | Park et al. | 437/52 |
| 5,501,998 | 3/1996 | Chen | 437/52 |

Primary Examiner—Charles L. Bowers, Jr.
Assistant Examiner—Lynne A. Gurley
Attorney, Agent, or Firm—George O. Saile; Stephen B. Ackerman; William J. Stoffel

[57] ABSTRACT

The present invention provides a method of manufacturing a cylindrical capacitor which begins by forming an insulating layer and a passivation layer composed of silicon nitride is over a substrate. A plug contact opening is formed through the passivation layer and the insulating layer. The insulating layer in the plug contact opening is selectively wet etched. The wet etching forms an overhanging portion of the passivation layer. A bottom plug is formed in the contact opening. A first dielectric layer having a cylindrical electrode opening is formed over passivation layer and the plug is exposed. A second polysilicon layer is formed over the first dielectric layer and in the cylindrical openings. A second dielectric layer is formed over the second polysilicon layer and in the cylindrical electrode opening. The second dielectric layer and the second polysilicon layer are planarized. The remaining second polysilicon layer in the cylindrical opening forms a cylindrical capacitor electrode over the bottom electrode plug. The first dielectric layer and the second dielectric layer are etched away. The overhang portion 21 of the passivation layer 20 and the bottom polysilicon plug 32 prevent the etch from etching voids in the underlying insulating layer 14 when the cylindrical electrode 50 is misaligned relative to the plug.

27 Claims, 6 Drawing Sheets

FORMATION OF A STACKED CYLINDRICAL CAPACITOR MODULE IN THE DRAM TECHNOLOGY

BACKGROUND OF INVENTION

1) Field of the Invention

This invention relates generally to fabrication of stacked capacitors for semiconductor devices and more particularly to the formation of stacked capacitors and contacts for memory semiconductor devices.

2) Description of the Prior Art

In the quest to achieve microminiaturization of integrated circuit devices, individual elements have been made very small and the elements have been closely packed. As devices are scaled down in dimension, there is a continuous challenge to produce smaller high density capacitors and connections to the substrate using a minimum number of process steps. For example in the recent past, integrated circuits with half a million transistors were produced with 2 micron line widths. Now, it is not uncommon to produce integrated circuits with several million transistors. As a result, conductive line widths were reduced to below 0.5 microns to attempt to maintain the overall size of integrate circuit chip. In the future, denser circuits will require that these line widths and connections must be made even smaller.

This miniaturization creates problems in photolithography alignment and in forming contacts to the substrate. Moreover, the decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of memory cell as well as consumes excessive power during low-voltage operation by impeding device operation. Therefore, stacked capacitors having a three-dimensional structure have been suggested to improve cell capacitance. Such stacked capacitors include double-stacked, fin-structured, cylindrical, spread-stacked, and box structured capacitors. Since both outer and inner surfaces can be utilized as an effective capacitor area, the cylindrical structure is favorably suitable to the three-dimensional stacked capacitor, and is more particularly suitable for an integrated memory cell which is 64 Mb or higher. A major challenge with these stacked capacitors is forming an electrical contact to the substrate.

Generally in the manufacturing of a DRAM cell of a highly integrated semiconductor device, making a storage electrode contact with a silicon substrate is a difficult process because of the precise alignment requirements of the various photolithography masks. Integrated circuit manufacturers have more difficulty aligning one feature to another and controlling tolerances as line widths decrease. For example, the alignment of the base of the bottom electrode (i.e., the plug) to the overlaying cylindrical electrode (bottom electrode) is critical. The alignment tolerances should be increased to reduce misalignment errors and yield losses.

When these microminiature capacitors are further reduced in size, it also becomes more difficult to improve the masking level tolerances and etch tolerances required for manufacturing good memory chips. To avoid these problems, others have proposed methods for self aligning the storage node contact of the capacitor to the device contact on the substrate. But they still require masking and etching steps to form the capacitor electrode structure.

A short coming with current methods of forming cylindrical capacitors is that it is difficult to align the bottom plug and cylinder of the bottom electrode. Tight photolithography tolerances are required to ensure that the cylinder is properly aligned over the plug and electrical contact is made to the substrate. Also if the plug and cylinder are not properly aligned, voids in underlying insulating layers can be formed by subsequent etches. To prevent this void formation, photo overlay tolerances can be increased, but this reduces the capacitor size/capacitance and thus the DRAM performance. In addition, stringers can be formed if top cylinder etches are not complete. Stringers are unwanted polysilicon material left over on the passivation layer after a polysilicon etch. These stringers can short out devices and reduce yields. Often, in order to protect against voids, the polysilicon etch time is reduced and as a result, stringers are formed.

The following U.S. patents show related processes and capacitor structures: U.S. Pat. No. 5,332,685 (Park) and U.S. Pat. No. 5,501,998 (Chen). These patents show approaches that use a structural solution to increase the storage node area and capacitance. However, these approaches can be improved by increasing the photo overlay tolerances between the plug to the electrode and to further reduce the capacitor size. Also, many of these prior art methods also require substantially more processing steps or/and planar structures which make the manufacturing process more complex and costly. In addition, other process methods rely on etching to a predetermined etch depth which can be quite difficult to control in a manufacturing environment. For example, during plasma etching outgassing, virtual or real leaks, back streaming from pumps and loading effects, to name a few, can change the chemistry of the etching environment in the process chamber, making a calibrated etch time approach difficult to control. Therefore, it is very desirable to develop processes that are as simple as possible and also provide methods for increasing the photolithography alignment tolerances and increase yields.

There is a challenge to develop methods of manufacturing these capacitors that minimize the manufacturing costs and maximize the device yields. In particular, there is a challenge to develop a method which minimizes the number of photoresist masking operations, eliminate stringers, and provide maximum photo alignment tolerances to maximize product yields. There is also a challenge to develop a cylindrical capacitor that is easy to manufacture and that minimizes defects caused by photo misalignment.

SUMMARY OF THE INVENTION

It is an object of the present invention to provide a method for fabricating a capacitor which provides a larger photolithography alignment window and improves yields.

It is an object of the present invention to provide a method for fabricating a cylindrical capacitor having a void free insulting layer and a stringer free bottom polysilicon electrode.

It is an object of the present invention to provide a method for fabricating a DRAM having a capacitor having larger process photo overlay tolerances from the bottom polysilicon plug to the polysilicon cylindrical electrode and which is low cost and simple to manufacture.

To accomplish the above objectives, the present invention provides a method of manufacturing a capacitor. A key feature of the invention is overhanging portion of the passivation layer formed by the wet etching of the first insulating layer. This overhang provides the larger overlay tolerance from the bottom polysilicon plug to the cylindrical electrode.

The method begins by providing a semiconductor substrate having a device region formed therein. An insulating layer 14 composed of silicon oxide is deposited over a substrate 10 surface. A passivation layer 20 preferably composed of silicon nitride is formed over the insulating layer 14. A plug contact opening 24 is formed through the passivation layer 20 and the insulating layer 14 exposing the device region 16. The insulating layer 14 in the plug contact opening 24 is selectively isotropically wet etched. The wet etch removes a first width 23 of the insulating layer 14 from the plug contact opening. The wet etching forms an overhanging portion 21 of the passivation layer 20. A first polysilicon layer 30 is deposited over the passivation layer 20 and in the contact openings 24 to form a bottom capacitor plug 32 and making an electrical contact to the device region 16. The first polysilicon layer 30 is anisotropically etched so that the top surface of the first polysilicon layer 32 is level with the top surface of the passivation layer 20. A first dielectric layer 40 is formed over the substrate surface 10. A cylindrical electrode opening 49 is formed in the first dielectric layer 40. The cylindrical electrode opening 49 at least partially exposes the plug contact opening 24. The cylindrical electrode opening 49 is defined by sidewalls of the first dielectric layer 40. A second polysilicon layer 44 is formed over the first dielectric layer 40 and on the sidewalls 48 of the first dielectric layer and contacting the bottom electrode plug. A second dielectric layer 46 is formed over the second polysilicon layer 44 and in the cylindrical electrode opening 49. The second dielectric layer 46 and the second polysilicon layer are planarized down to the level of the top surface of the first dielectric layer 40. The remaining second polysilicon layer forms a cylindrical capacitor electrode 50 over the bottom electrode plug 32. The first dielectric layer 40 and the second dielectric layer 46A are removed. A capacitor dielectric layer 54 and a third polysilicon layer 60 are sequentially formed over the cylindrical capacitor electrode 50 thereby forming capacitor.

The invention provides a method of forming a capacitor that provides a larger overlay tolerance from the bottom polysilicon plug 32 to the cylindrical electrode 50. An important feature of the invention is overhang of the passivation layer formed by the wet etching of the first insulating layer. This overhang provides the larger overlay tolerance from the bottom poly plug to the top cylindrical electrode. The overhang and the polysilicon plug also prevent voids from forming in the insulating layer during the etching of the second dielectric layer 46 due to misalignment of the cylindrical electrode opening 49. The method allows the etchback of the first polysilicon to be extended without having voids etched in the insulating layer 14. Because the invention allows an overetch of the first polysilicon layer (without forming voids), stringers are not formed. The method enlarges the process etchback window of the first polysilicon layer 30 (to form the polysilicon plug) to which allows an "overetch" which eliminates the polysilicon stringers. The reduction in overlay tolerance increases the size of the capacitor cylinder relative to cell size and thus increases memory performance.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a cylindrical capacitor which has larger photolithography overlay tolerances and is simple to manufacture. The invention also provides for a dynamic random access memory (DRAM) having the cylindrical capacitor.

It should be will understood by one skilled in the art that by including additional process steps not described in this embodiment, other types of devices can also be included on the chip. For example, P wells in the P substrate and CMOS circuits can be formed therefrom. It should also be understood that the figures depict only one DRAM storage cell out of a multitude of cells that are fabricated simultaneously on the substrate. Also, the capacitor can be used in other chip types in addition to DRAM chips.

Figure 1:
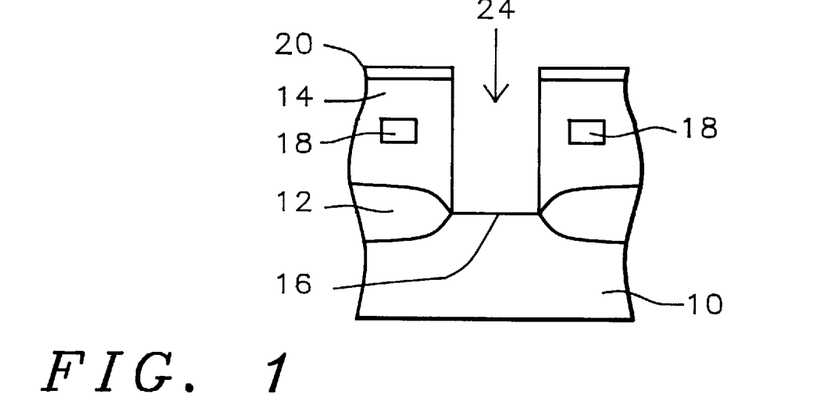
FIGS. 1 through 7 are cross sectional views for illustrating a method for manufacturing the cylindrical capacitor according to the present invention.

As shown in FIG. 1, the method begins by providing semiconductor structure comprising a semiconductor substrate 10 having a device region 16 formed therein. Structure 10 is understood to include a semiconductor wafer, and active and passive devices formed within the wafer and layers formed on the wafer surface. The structure is a product of processes performed on the wafer. The term "substrate surface" is meant to include the upper most exposed layers over a semiconductor wafer, such as a silicon surface, an insulating layer and metallurgy lines.

Figure 8:
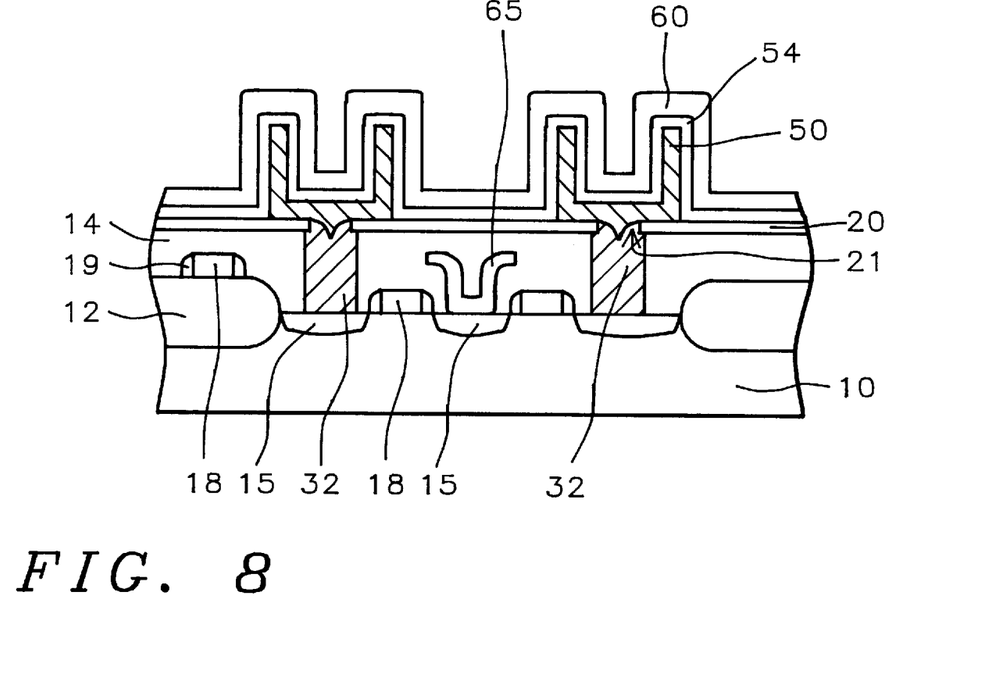
FIG. 8 is a cross sectional view of illustrating a method of manufacturing the dynamic random access memory (DRAM) having the cylindrical capacitor of the present invention.

For example, as shown in FIG. 8, the semiconductor structure 10 can include field oxide regions 12, and a MOS transistor 15 18 19 having source/drains, gate electrodes and word lines 18 with sidewall spacers 19. Additionally, the semiconductor structure can comprises word lines 18 and other devices formed on the wafer.

Field oxide regions 12 are formed on the substrate. One method of forming these regions is describe by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions.

An insulating layer 14 then is deposited over a substrate 10 surface. The insulating layer 14 can be composed of BPTEOS (BPSG formed using Tetraethylorthosilicate), borophosphosilicate glass (BPSG) or silicon oxide and is more preferably composed of silicon oxide. The insulating layer 14 preferably has a thickness in a range of about 5000 and 15,000 Å. As shown in FIG. 8, the insulating layer covers the devices 12, 15, 18 19 on the wafer 10 (i.e., covers the substrate surface).

Still referring to FIG. 1, a passivation layer 20 is formed over the insulating layer 14. The passivation layer 20 is preferably composed of oxynitride or silicon nitride and is more preferably composed of silicon nitride. The passivation layer 20 preferably has a thickness in a range of between about 100 and 1500 Å.

A plug contact opening 24 is formed through the passivation layer 20 and the insulating layer 14 exposing the device region 16. The plug contact opening 24 can be formed by conventional photolithographic processes, such as photoresist coat, expose, develop, etch and remove. The plug contact opening 24 (e.g., contact opening) is used to define the polysilicon plug contact to the source region 15. The contact opening preferably has an area in a range of about 0.032 and 1.0 $\mu m^2$ and more preferably, in a range of about 0.032 and 0.25 $\mu m^2$.

Figure 2:
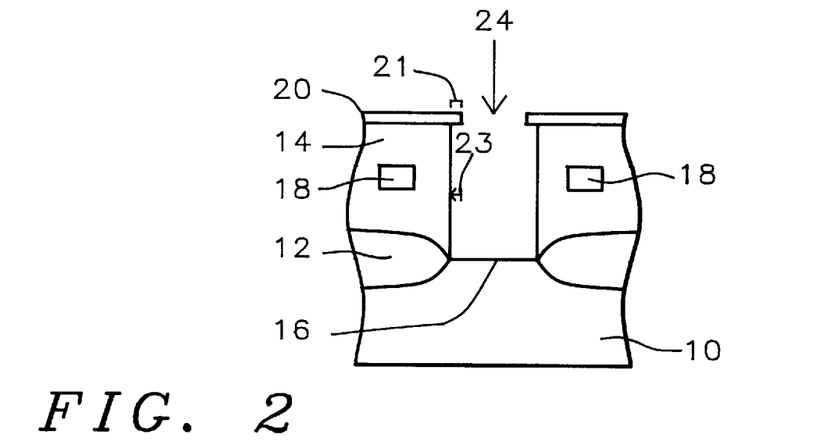

Turning to FIG. 2, in an important step, the insulating layer 14 exposed in the plug contact opening 24 is selectively etched, preferably by a isotropic wet etch. The wet etch removes a first width 23 of the insulating layer 14 preferably more than 100 Å and more preferably in the range of between about 100 and 200 Å. The wet etching forming an overhanging portion 21 of the passivation layer 20. The overhanging portion 21 preferably has a width (extending beyond the edge of the insulating layer 14 in the opening) more than 100 Å and more preferably between about 100 and 200 Å.

The selective wet etch of the insulating layer is preferably performed with buffered oxide etch (BOE) (e.g., HF and $NH_4F$ ), or a HF dip etch. After the selective wet etch, the contact opening can be cleaned, for example using B clean (or RCA clean) reagents. As explained below and shown in FIGS. 9 and 10, the overhang 21 will increase the photo overlay tolerances and eliminate voids.

Figure 3:
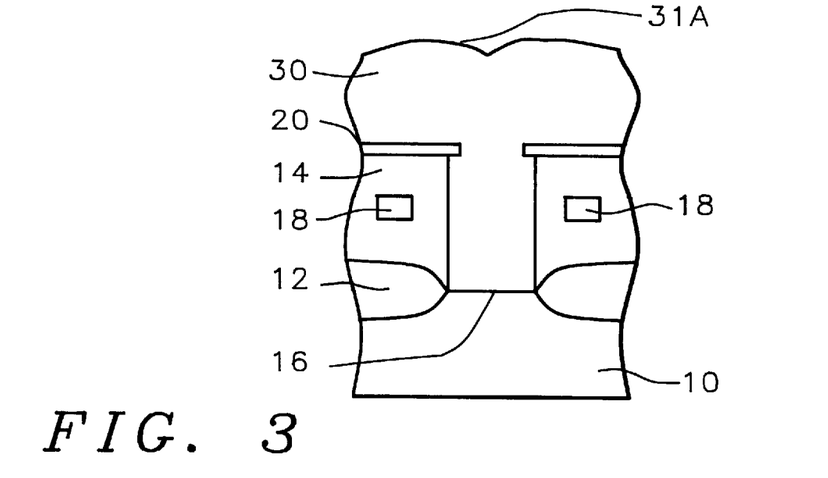

As shown in FIG. 3, a first polysilicon layer 30 is deposited over the passivation layer 20 and in the contact openings 24 forming a bottom capacitor plug 32 and making an electrical contact to the device region 16. The first polysilicon layer fills the area under the overhang 21 forming an etch barrier. The first polysilicon layer has a thickness in a range of between about 1000 and 5000 Å. The first polysilicon layer 30 is preferably doped with an impurity with a concentration in a range of about 1E15 and 1E21 atoms/cm³. The first polysilicon layer can have an indention 31 A over the plug contact opening 24 as shown in FIG. 3.

Figure 4:
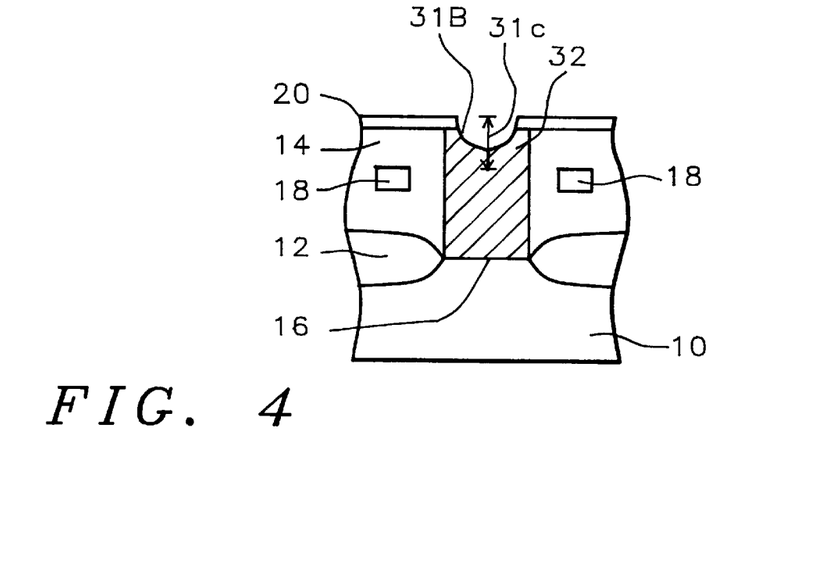

As shown in FIG. 4, the first polysilicon layer 30 is anisotropically etched or planarized so that the top surface of the first polysilicon layer 32 is level with the top surface of the passivation layer 20. The first polysilicon layer 30 can also be chemical-mechanical polished (CMP).

The anisotropic etch can propagate the indention 31A in the first polysilicon layer 30 as shown in FIG. 4. The indentation preferably has a depth 31C in a range of about 500 and 4500 Å. It is important that this first polysilicon layer etch be complete so that stringers are removed. Stringers left on the passivation layer surface can short out devices. The overhanging portion 21 of the passivation layer allows a first polysilicon layer "overetch" which eliminates stringers. The overhang also prevents the overetch from forming voids in the insulating layer 14 (Compare with FIGS. 12 and 13).

Figure 5:
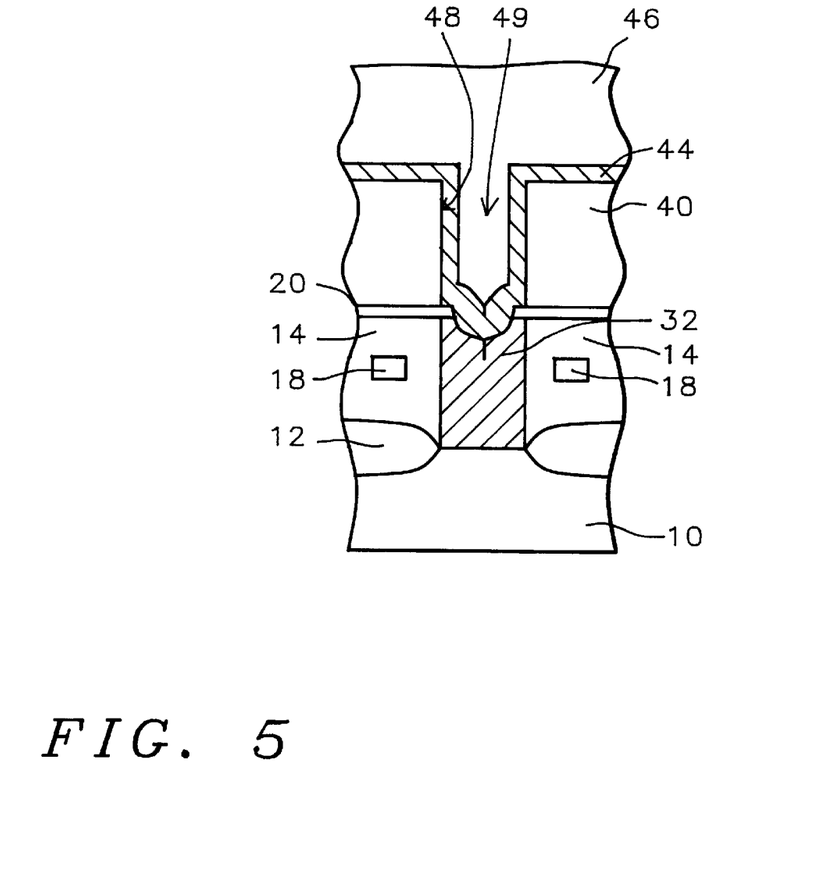

As shown in FIG. 5, a first dielectric layer 40 is formed over the substrate surface 10 including the passivation layer 20 and the bottom electrode plug 32. The first dielectric layer 40 can be composed of Tetraethylorthosilicate (TEOS) silicon oxide, borophosphosilicate glass (BPSG), and silicon oxide and is more preferably formed of silicon oxide. The first dielectric layer preferably has a thickness in a range of between about 2000 and 10,000 Å.

Still referring to FIG. 5, a cylindrical electrode opening 49 (e.g., bottom electrode opening 49) is formed in the first dielectric layer 40 and the bottom plug 32. The cylindrical electrode opening 49 (e.g., bottom electrode opening) at least partially exposes the plug contact opening 24. The cylindrical electrode opening 49 is defined by sidewalls of the first dielectric layer 40. The cylindrical electrode opening 49 preferably has an area in a range of about 0.054 and 1.2 $\mu m^2$. The cylindrical electrode opening 49 can have any shape such as a circular or rectangular shape. The opening can also have almost any width, being limited only by the layout design and can certainly be larger and wider than illustrated in the figures.

Subsequently, a second polysilicon layer 44 is formed over the first dielectric layer 40 and on the sidewalls 48 of the first dielectric layer. The second polysilicon layer contacts the bottom electrode plug 32. The second polysilicon layer 44 will be used to form a cylindrical capacitor electrode 50. The second polysilicon layer 44 preferably has a thickness in a range of between about 200 and 1500 Å. The second polysilicon layer 44 preferably has an impurity doping concentration in a range of about 1E15 and 1E21 atoms/cm³.

A second dielectric layer 46 is formed over the second polysilicon layer 44 and in the cylindrical electrode opening 49. The second dielectric layer 46 is preferably composed of Tetraethylorthosilicate (TEOS) oxide, BPSG, and silicon oxide and more preferably formed of silicon oxide. The second dielectric layer preferably has a thickness in a range of between about 5000 and 20,000 Å.

Figure 6:
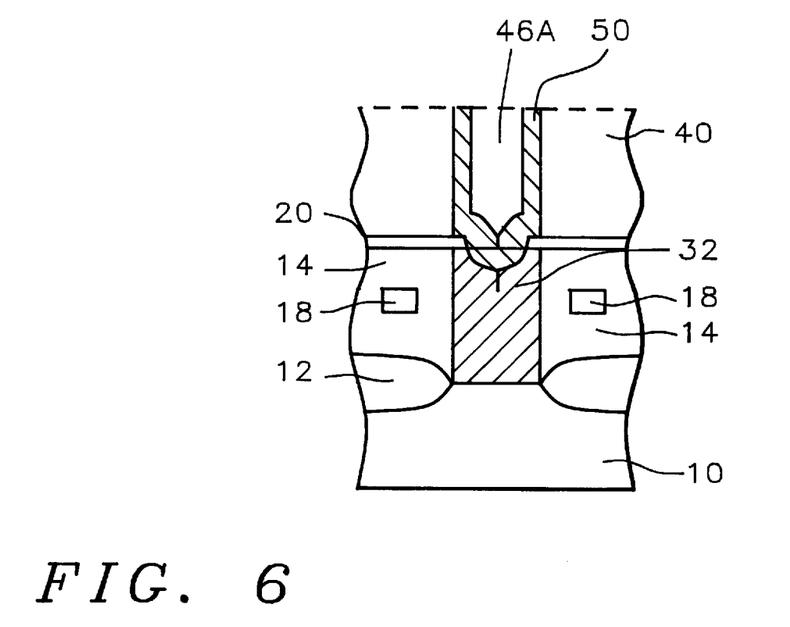

As shown in FIG. 6, the second dielectric layer 46 and the second polysilicon layer are preferably planarized down to the level on the top surface of the first dielectric layer 40. The second polysilicon layer 44 on the top surface of the first dielectric layer 40 is removed. The second polysilicon layer forms a cylindrical capacitor electrode 50 (e.g., bottom capacitor electrode 50) over the bottom electrode plug. The second dielectric layer 46 and the second polysilicon layer can be planarized by an anisotropic etch (e.g., a RIE etch). A chemical-mechanical polish (CMP) could also be used to remove the second dielectric layer 46 and the second polysilicon layers 44, such as a 1 or 2 step CMP.

Figure 7:
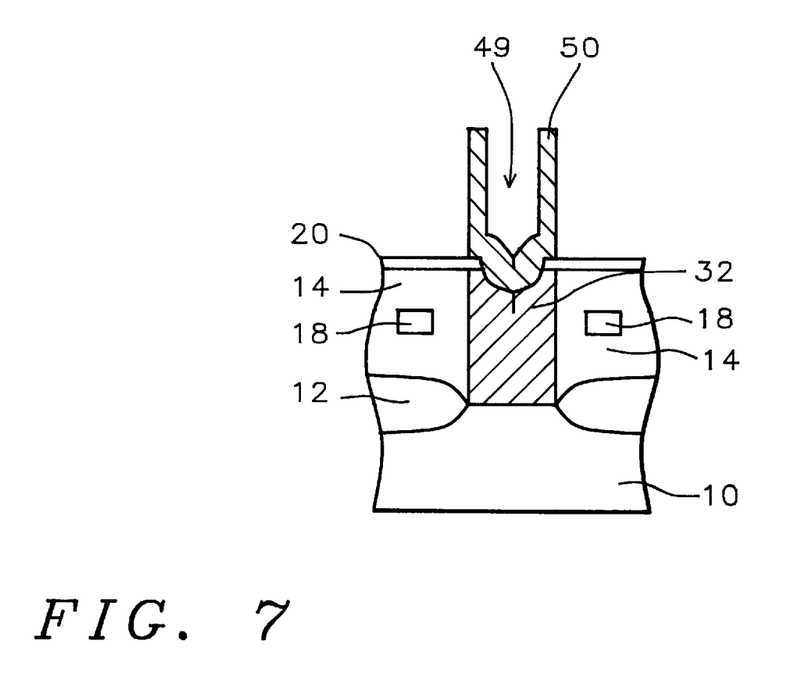

As shown in FIG. 7, the first dielectric layer 40 and the second dielectric layer 46A are removed. The first dielectric layer 40 and the second dielectric layer 46A can be removed using a conventional etch selective to the material of these layers (e.g., silicon oxide). The passivation layer 20, polysilicon layer 50 and overhang 21 act as etch barriers to prevent the etching of voids in the insulating layer 14.

As shown in FIG. 8, a capacitor dielectric layer 54 and a third polysilicon layer 60 (e.g., top capacitor plate electrode) are sequentially formed over the cylindrical capacitor electrode 50 thereby forming capacitor. The capacitor dielectric layer 54 can be composed on any pinhole free layer having a high dielectric constant such as a silicon oxide layer, a nitride/oxide layer (NO) or ONO. The third polysilicon layer 60 forms the top plate electrode for the capacitor. The third polysilicon layer 60 preferably has a thickness in a range of between about 70 and 400 Å.

As shown in FIG. 8, the invention provides a method for forming a dynamic random access memory (DRAM) having the improved cylindrical capacitor and contacts. FIG. 8 shows the substrate 10 including spaced field oxide regions 12 and transistors 15 18 having source and drain regions 15 and gate electrode 18 and sidewall spacers 19. The bottom plug 32 contacts the node 15 of the transistor. Bitline 65 is located under the capacitor. Also, word lines 18 19 can be formed over field oxide regions 12. More than one capacitor can be formed on a substrate and the top plate electrode 60 can connect a plurality of cylindrical electrodes.

Figure 9:
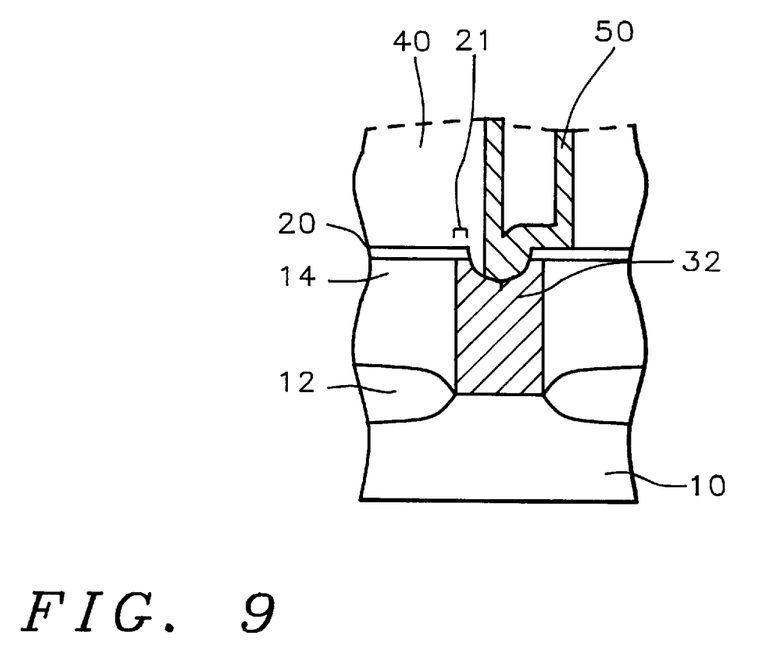
FIGS. 9 and 10 are cross-sectional view of the capacitor of the present invention showing how the overhanging passivation layer 20 21 and the plug 32 prevent voids from forming when the top electrode 50 is mis-aligned.
Figure 10:
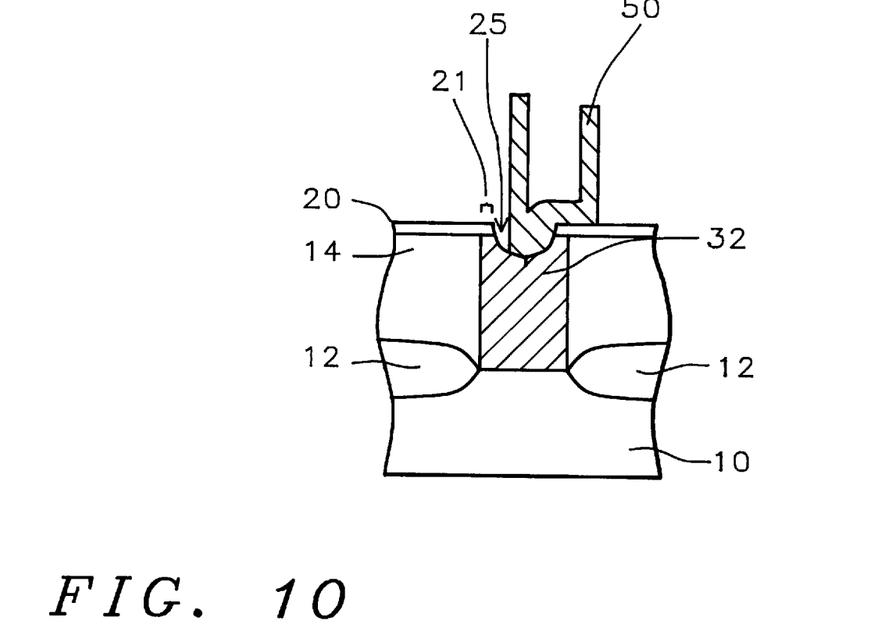

FIGS. 9 and 10 illustrate the advantages of the invention in forming void free insulation layer and increased overlay tolerances. In FIG. 9, the bottom electrode contact mask is mis aligned causing the edge of the bottom cylindrical electrode 50 to lie in the indentation 31B and partially expose the bottom plug 32. As shown in FIG. 10, the plug 32 and overhang 21 prevent voids in the insulating layer 14. Arrow 25 shows the path of the acid which is stopped by the plug 32 and the overhang 21.

Figure 11:
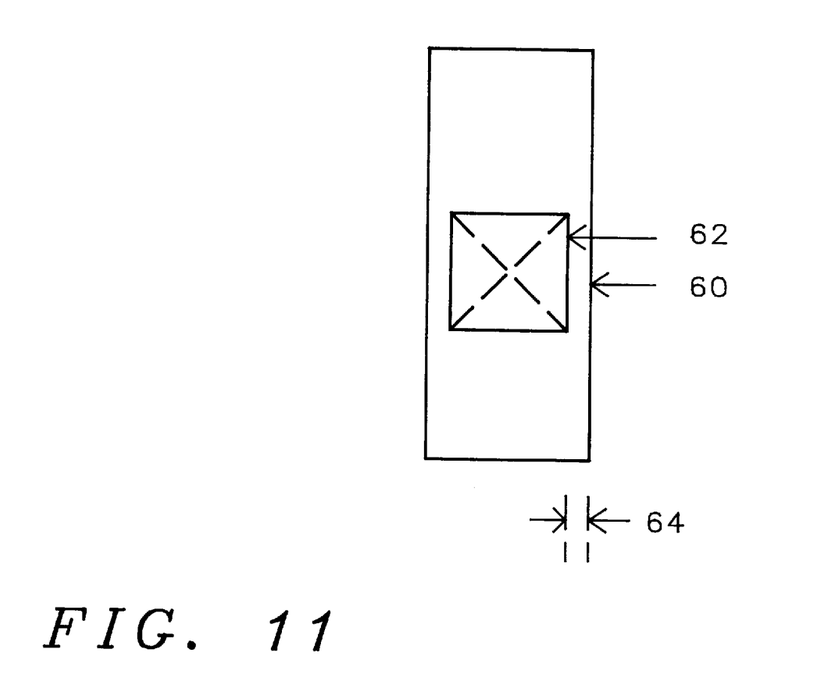
FIG. 11 is a top down view of a capacitor showing the overlay tolerance of a stacked cylindrical capacitor.

FIG. 11 shows a top down view of the capacitor of the conventional construction. The cylindrical contact pattern 60 is shown next to the plug contact photo mask 62. The overlay 64 for the two masks/devices is shown. The overlay 64 is overlay required by the a process so to prevent the voids in the insulating layer 14.

Figure 12:
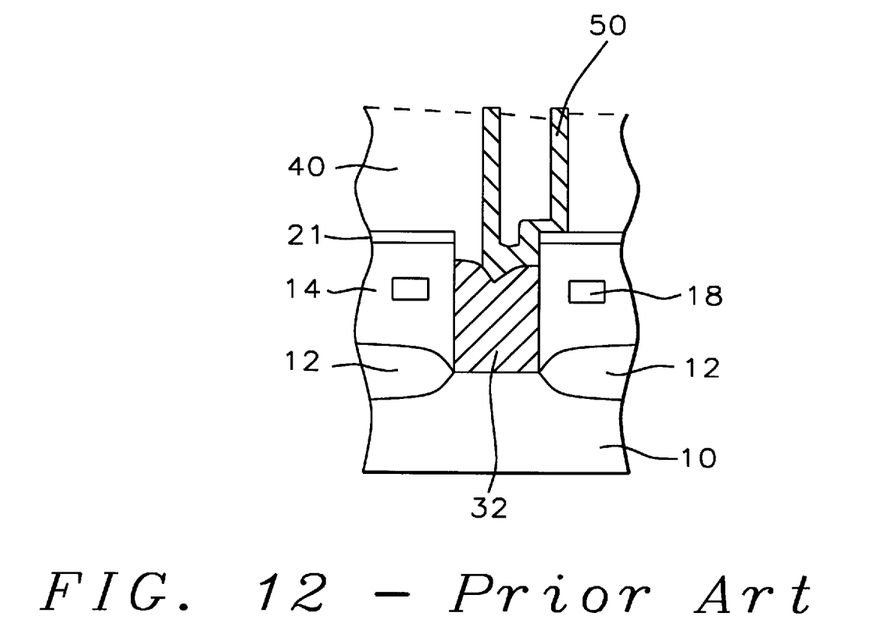
FIGS. 12 and 13 are cross sectional views of a capacitor having a void problem caused by misalignment of the cylinder bottom electrode 50 and the plug 32 that is prevented by the capacitor of the present invention.
Figure 13:
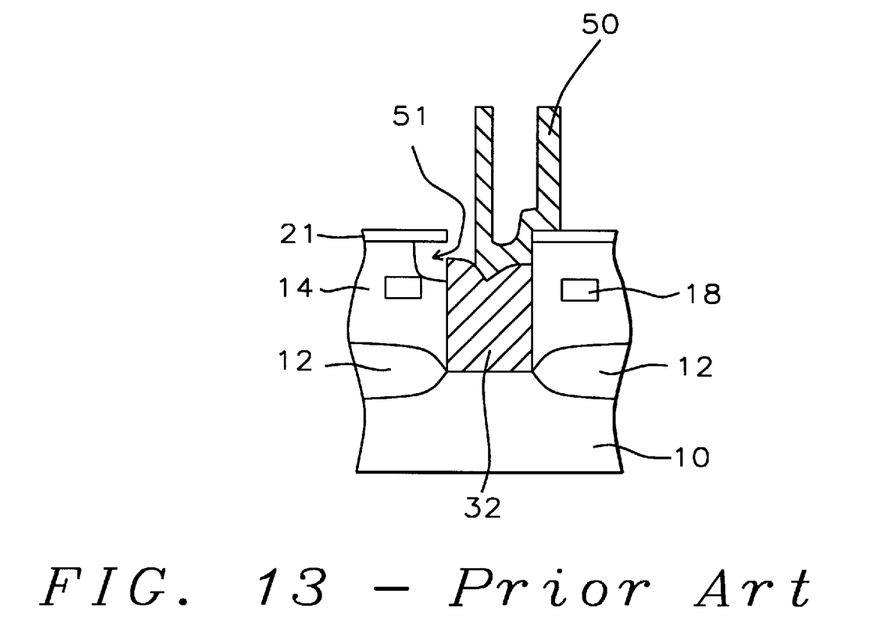

FIGS. 12 and 13 show the effects of misalignment in producing a void in the insulating layer 14 using a process without the overhang 21 of the present invention. As shown in FIG. 12, the top electrode 50 is misaligned relative to the plug 32 and plug opening thus allows the first dielectric layer 40 to contact the insulating layer 14 and plug 32. As shown in FIG. 13, when the first dielectric layer 40 is etched away, a void 51 is formed in the insulating layer 14. In contrast, as shown in FIGS. 9 and 10, the overhang 21 of the present invention and the plug 32 form an etch proof barrier around the first insulation layer 14 thus preventing the void from forming.

The invention provides a method of forming a capacitor that provides a larger overlay tolerance from the bottom polysilicon plug to the top cylindrical electrode. A key feature of the invention is the forming of the overhang 21 of the passivation layer 20 by the wet etching of the first insulating layer 14. This overhang provides the larger overlay tolerance from the bottom poly plug to the top cylindrical electrode. The overhang and the polysilicon plug also prevent voids from forming in the insulating layer during the etching of the second dielectric layer 46 due to misalignment of the cylindrical electrode opening 49.

The method also enlarges the process window of the polysilicon plug etching to prevent the formation of polysilicon stringers. The method allows the etchback of the first polysilicon to be extended (e.g., overetched) without having voids etched in the insulating layer 14. Because the invention allows an overetch of the first polysilicon layer, stringers are not formed. Stringers are unwanted portions of the first polysilicon layer that remain on the substrate surface after the polysilicon etch back. These strings can cause shorts and reduce yields.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a capacitor on a semiconductor structure having a device region formed therein comprising the steps of:

a) forming sequentially an insulating layer and a passivation layer over a semiconductor structure, said semiconductor structure comprising a substrate having at least a device region;

b) forming a plug contact opening through said passivation layer and said insulating layer exposing said device region;

c) selectively wet etching said insulating layer in said plug contact opening, the wet etch removing a first width of said insulating layer from said plug contact opening, the wet etching forming an overhanging portion of said passivation layer;

d) forming a bottom electrode plug in said contact opening;

e) forming a cylindrical capacitor electrode over said bottom electrode plug; and f) forming sequentially a capacitor dielectric layer and a third polysilicon layer over said cylindrical capacitor electrode thereby forming a capacitor.

2. The method of claim 1 wherein said cylindrical capacitor electrode is formed by a) forming a first dielectric layer over said passivation layer and said bottom electrode plug;

b) forming a cylindrical electrode opening in said first dielectric layer, said cylindrical electrode opening at least partially exposing said plug contact opening, said cylindrical electrode opening defined by sidewalls of said first dielectric layer;

c) forming a second polysilicon layer over said first dielectric layer and on said sidewalls of said first dielectric layer and contacting said bottom electrode plug, said second polysilicon layer forming a cylindrical capacitor electrode;

d) forming a second dielectric layer over said second polysilicon layer and in said cylindrical electrode opening;

e) planarizing said second dielectric layer and said second polysilicon layer down to the level on the top surface of said first dielectric layer, leaving a remaining second polysilicon layer forming a cylindrical capacitor electrode over said bottom electrode plug;

f) removing said first dielectric layer and said second dielectric layer.

3. The method of claim 1 wherein said semiconductor structure further includes transistors having source regions, drain regions, and gate electrodes, said source regions connected to said bottom electrode plug.

4. The method of claim 1 wherein said first width of insulating layer wet etched is in the range of between about 100 and 200 Å.

5. The method of claim 1 wherein said passivation layer has a thickness in a range of between about 5000 and 15000 Å and comprises silicon nitride.

6. The method of claim 1 wherein said plug contact opening has a diameter in a range of about 0.5 and 0.18 $\mu$m.

7. The method of claim 1 wherein said plug contact opening has an area in a range of about 0.25 and 0.032 $\mu m^2$.

8. The method of claim 1 wherein said selective wet etch is performed with an etch selected from the group consisting of: buffered oxide etch (BOE) and HF.

9. The method of claim 1 wherein said insulating layer has a thickness in a range of about 5000 and 15,000 Å and comprises silicon oxide.

10. The method of claim 1 wherein said first dielectric layer is a material selected from the group consisting of:

TEOS, BPSG, and silicon oxide, and having a thickness in a range of between about 2000 and 10,000 Å.

11. The method of claim 1 wherein said cylindrical electrode opening has an area in a range of about 0.054 and 1.2 $\mu m^2$.

12. The method of claim 2 wherein said second polysilicon layer has a thickness in a range of between about 200 and 1500 Å.

13. The method of claim 2 wherein said second dielectric layer is a material selected from the group consisting of: Tetraethylorthosilicate (TEOS), borophosphosilicate glass (BPSG), and silicon oxide, and has a thickness in a range of between about 5000 and 20,000 Å.

14. A method of fabricating a capacitor on a semiconductor substrate having a device region formed therein comprising the steps of:

a) depositing an insulating layer comprising silicon oxide over a substrate surface;

b) forming a passivation layer comprising silicon nitride over said insulating layer;

c) forming a plug contact opening through said passivation layer and said insulating layer exposing said device region;

d) selectively wet etching said insulating layer in said plug contact opening, the wet etch removing a first width of said insulating layer, the wet etching forming an overhanging portion of said passivation layer;

e) depositing a first polysilicon layer over said passivation layer and in said plug contact opening to form a bottom electrode plug in said plug contact opening and making an electrical contact to said device region;

f) anisotropically etching said first polysilicon layer so that the top surface of said first polysilicon layer is level with the top surface of said passivation layer thereby leaving said bottom electrode plug in said plug contact opening;

g) forming a first dielectric layer over the substrate surface;

h) forming a cylindrical electrode opening in said first dielectric layer, said cylindrical electrode opening at least partially exposing said plug contact opening, said cylindrical electrode opening defined by sidewalls of said first dielectric layer;

i) forming a second polysilicon layer over said first dielectric layer and on said sidewalls of said first dielectric layer and contacting said bottom electrode plug, said second polysilicon layer forming a cylindrical capacitor electrode;

j) forming a second dielectric layer over said second polysilicon layer and in said cylindrical electrode opening;

k) planarizing said second dielectric layer and said second polysilicon layer down to the level on the top surface of said first dielectric layer, leaving a remaining second polysilicon layer in said cylindrical electrode opening forming a cylindrical capacitor electrode over said bottom electrode plug;

l) removing said first dielectric layer and said second dielectric layer; and m) forming sequentially a capacitor dielectric layer and a third polysilicon layer over said cylindrical capacitor electrode thereby forming a capacitor.

15. The method of claim 14 wherein said semiconductor substrate further includes transistors having source regions, drain regions, and gate electrodes, said source regions connected to said bottom electrode plug.

16. The method of claim 14 wherein said first width of insulating layer wet etched is in the range of between about 100 and 200 Å.

17. The method of claim 14 wherein said passivation layer has a thickness in a range of between about 5000 and 15000 Å and comprises silicon nitride.

18. The method of claim 14 wherein said plug contact openings have a diameter in a range of about 0.5 and 0.18 $\mu m$.

19. The method of claim 14 wherein said selective wet etch is performed with an etch selected from the group consisting of: buffered oxide etch (BOE) and HF.

20. The method of claim 14 wherein said first polysilicon layer has a thickness in a range of between about 1000 and 5000 Å and is doped with an impurity with a concentration in a range of about 1E15 and 1E21 atoms/cm$^3$.

21. The method of claim 14 wherein said insulating layer has a thickness in a range of about 5000 and 15,000 Å and comprises silicon oxide.

22. The method of claim 14 wherein said plug contact opening has an area in a range of about 0.25 and 0.032 $\mu m^2$.

23. The method of claim 14 wherein said first dielectric layer is a material selected from the group consisting of TEOS, BPSG, and silicon oxide, and having a thickness in a range of between about 2000 and 10,000 Å.

24. The method of claim 14 wherein said cylindrical electrode opening has an area in a range of about 0.054 and 1.2 $\mu m^2$.

25. The method of claim 14 wherein said second polysilicon layer has a thickness in a range of between about 200 and 1500 Å.

26. The method of claim 14 wherein said second dielectric layer is a material selected from the group consisting of: Tetraethylorthosilicate (TEOS), borophosphosilicate glass (BPSG), and silicon oxide, and has a thickness in a range of between about 5000 and 20,000 Å.

27. A method of fabricating a capacitor on a semiconductor substrate having a device region formed therein comprising the steps of:

a) depositing an insulating layer comprising silicon oxide over a substrate surface;

b) forming a passivation layer comprising silicon nitride over said insulating layer;

c) forming a plug contact opening through said passivation layer and said insulating layer exposing said device region;

d) selectively wet etching said insulating layer in said plug contact opening, the wet etch removing a first width of said insulating layer, the wet etching forming an overhanging portion of said passivation layer, said overhanging portion having a width in a range of between about 100 and 200 Å;

e) depositing a first polysilicon layer over said passivation layer and in said contact opening to form a bottom electrode plug in said plug contact opening and making an electrical contact to said device region;

f) anisotropically etching said first polysilicon layer so that the top surface of said first polysilicon layer is level with the top surface of said passivation layer thereby leaving said bottom electrode plug in said plug contact opening;

g) forming a first dielectric layer over the substrate surface;

h) forming a cylindrical electrode opening in said first dielectric layer, said cylindrical electrode opening at least partially exposing said plug contact opening, said cylindrical electrode opening defined by sidewalls of said first dielectric layer;

i) forming a second polysilicon layer over said first dielectric layer and on said sidewalls of said first dielectric layer and contacting said bottom electrode plug, said second polysilicon layer forming a cylindrical capacitor electrode;

j) forming a second dielectric layer over said second polysilicon layer and in said cylindrical electrode opening;

k) planarizing said second dielectric layer and said second polysilicon layer down to the level on the top surface of said first dielectric layer, leaving a remaining second polysilicon layer in said cylindrical electrode opening forming a cylindrical capacitor electrode over said bottom electrode plug;

l) removing said first dielectric layer and said second dielectric layer; and m) forming sequentially a capacitor dielectric layer and a third polysilicon layer over said cylindrical capacitor electrode thereby forming a capacitor.

* * * * *